United States Patent [19]
Tokano

[11] Patent Number: 5,488,677
[45] Date of Patent: Jan. 30, 1996

[54] ELECTRIC FIELD SENSOR

[75] Inventor: Yuichi Tokano, Sendai, Japan

[73] Assignee: Tokin Corporation, Miyagi, Japan

[21] Appl. No.: 397,076

[22] PCT Filed: Jul. 7, 1994

[86] PCT No.: PCT/JP94/01110

§ 371 Date: Mar. 7, 1995

§ 102(e) Date: Mar. 7, 1995

[87] PCT Pub. No.: WO95/02193

PCT Pub. Date: Jan. 19, 1995

[30] Foreign Application Priority Data

| Jul. 7, 1993 | [JP] | Japan | 5-167857 |
| Jul. 7, 1993 | [JP] | Japan | 5-167861 |
| Feb. 25, 1994 | [JP] | Japan | 6-053256 |

[51] Int. Cl.⁶ .................................. G02F 1/035
[52] U.S. Cl. .................... 385/3; 250/227.11
[58] Field of Search ................ 385/3, 4, 8, 12, 385/2; 250/227.11, 225; 324/96, 106, 244.1; 356/364

[56] References Cited

U.S. PATENT DOCUMENTS

| 5,008,678 | 4/1991 | Herman | 342/158 |
| 5,021,731 | 6/1991 | Saaski et al. | 324/96 |
| 5,210,407 | 5/1993 | Ito et al. | 250/227.11 |
| 5,227,715 | 7/1993 | Ito et al. | 250/225 |
| 5,267,336 | 11/1993 | Sriram et al. | 385/2 |
| 5,402,259 | 4/1995 | Lembo et al. | 385/2 |

FOREIGN PATENT DOCUMENTS

| 59-124366 | 8/1981 | Japan . |
| 59-155764 | 9/1984 | Japan . |

*Primary Examiner*—Akm E. Ullah
*Attorney, Agent, or Firm*—Frishauf, Holtz, Goodman, Langer & Chick

[57] ABSTRACT

An electric field sensor comprises a sensor head 1, a package 13 accommodating the sensor head, and an antenna 14 attached to the outside of the package and connected to the sensor head 1. The sensor head 1 has a substrate 3 and an optical modulator 4 attached thereto. The optical modulator 4 has an incident optical waveguide 5 formed on the substrate 3, two phase-shift optical waveguides 6 which are formed on the substrate 3 to be branched from the incident optical waveguide 5 and each of which has a variable refractive index varying in response to an electric field intensity applied thereto, an outgoing optical waveguide 7 formed on the substrate 3 to join the phase-shift optical waveguides 6, and two modulation electrodes 8 formed on or in the vicinity of the phase-shift optical waveguides 6. The antenna 14 has two rod antenna elements 17 and 18. The rod antenna elements 17 and 18 extend in opposite directions with their one ends located at a center portion of the package 13 and are arranged in parallel to the phase-shift optical waveguides 6.

4 Claims, 7 Drawing Sheets

ELECTRIC FIELD SENSOR

TECHNICAL FIELD

This invention relates to an electric field sensor for measuring an electric field intensity of an electromagnetic wave or the like.

BACKGROUND ART

FIG. 1 shows a conventional electric field sensor. The electric field sensor comprises a sensor head 1 and an antenna 2 connected to the sensor head 1. The sensor head 1 has a substrate 3 and an optical modulator 4 attached to the substrate 3.

The optical modulator 4 comprises an incident optical waveguide 5 formed on the substrate 3, two phase-shift optical waveguides 6 which are formed on the substrate 3 to be branched from the incident optical waveguide 5 and each of which has a variable refractive index varying in response to an electric field intensity applied thereto, an outgoing optical waveguide 7 formed on the substrate 3 to join the phase-shift optical waveguides 6, and two modulation electrodes 8 formed on or in the vicinity f the phase-shift optical waveguides 6. The incident optical waveguide 5 is connected to an incident optical fiber 9. The outgoing optical waveguide 7 is connected to an outgoing optical fiber 10.

The antenna 2 has two rod antenna elements 11. The rod antenna elements 11 are connected through lead wires 12 to the modulation electrodes 8, respectively. The rod antenna elements 11 are arranged to face a direction of an electric field, in other words, to be perpendicular to the phase-shift optical waveguides 6. The rod antenna elements 11 are fixed to a package which is not illustrated in the figure.

In the conventional electric field sensor, the antenna elements face the direction of the electric field during measurement. Accordingly, a draw-out portion of the optical fiber faces a direction of measurement. This possibly results in a damage of the optical fiber.

In the conventional electric field sensor, the antenna must be arranged in various directions during measurement because of its strict directivity.

It is an object of this invention to provide an electric field sensor capable of preventing a damage of an optical fiber.

It is another object of this invention to provide an electric field sensor which need not be arranged in various directions during measurement.

DISCLOSURE OF THE INVENTION

This invention comprises a sensor head having a substrate and an optical modulator attached to the substrate, a package accommodating the sensor head, and an antenna attached to the outside of the package and connected to the optical modulator. The optical modulator comprises two phase-shift optical waveguides each of which has a variable refractive index varying in response to an electric field intensity applied thereto, and modulation electrodes formed on or in the vicinity of the phase-shift optical waveguides. The antenna has two rod antenna elements respectively connected to the modulation electrodes. The rod antenna elements extend in opposite directions with their one ends located at a center portion of the package and are arranged in parallel to the phase-shift optical waveguides.

This invention may have a structure such that the antenna comprises two film antenna elements respectively connected to the modulation electrodes and fixedly attached to a side surface of the package and that the film antenna elements extend in opposite directions with their one ends located at a center portion of the package and are arranged in parallel to the phase-shift optical waveguides.

This invention may have a structure such that the antenna comprises two film antenna elements respectively connected to the modulation electrodes and formed on the substrate in parallel to the phase-shift optical waveguides.

Furthermore, this invention comprises a sensor head having a substrate and a plurality of optical modulators attached to the substrate, and a plurality of antennas respectively connected to the optical modulators. Each of the optical modulators comprises an incident optical waveguide formed on the substrate, two phase-shift optical waveguides which are formed on the substrate to be branched from the incident optical waveguide and each of which has a variable refractive index varying in response to an electric field intensity applied thereto, an outgoing optical waveguide formed on the substrate to join the phase-shift optical waveguides, and modulation electrodes formed on or in the vicinity of the phase-shift optical waveguides. The antennas are respectively connected to the modulation electrodes of a plurality of the optical modulators.

EMBODIMENTS

Figure 1:
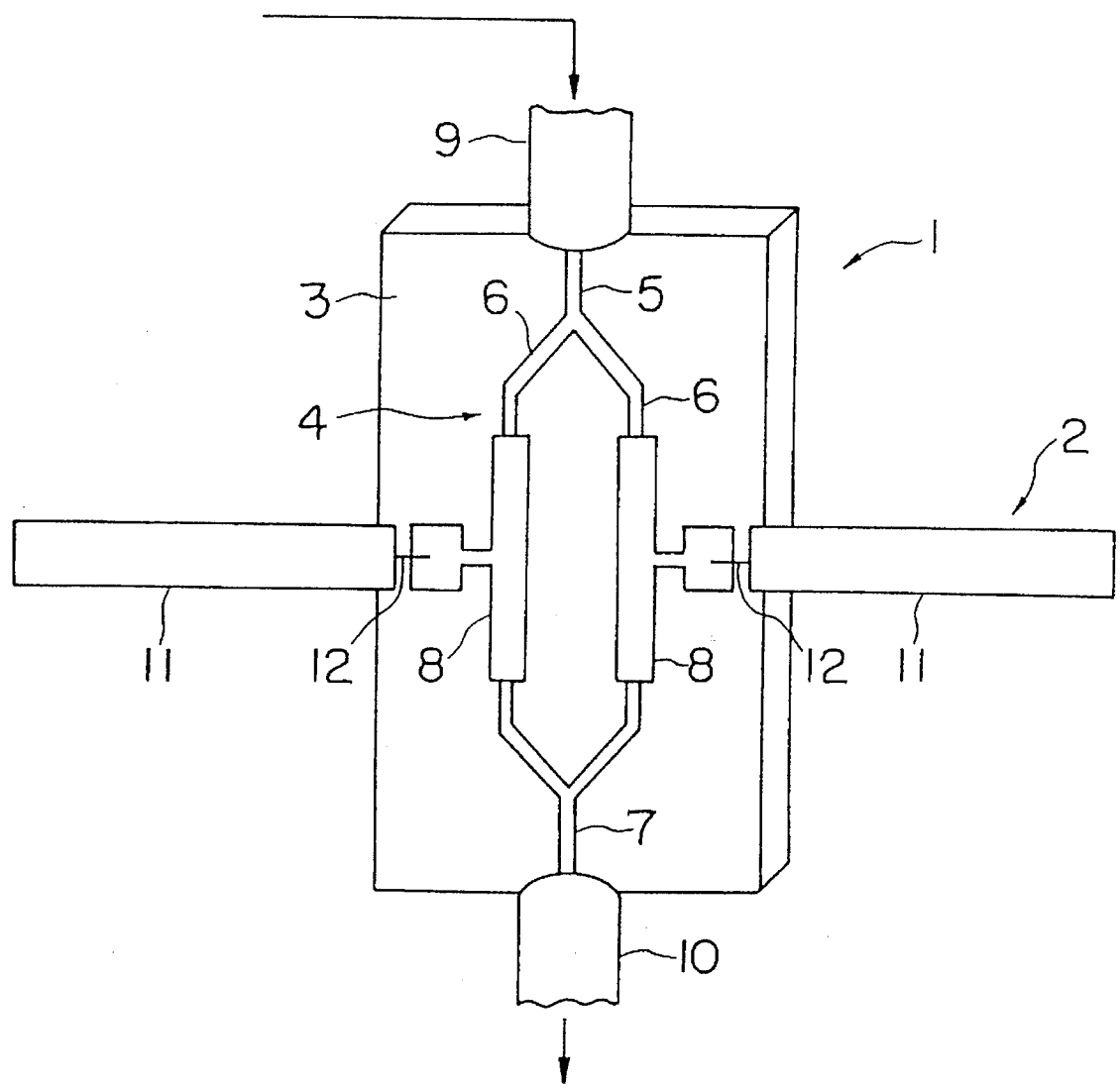
FIG. 1 is a perspective view of a conventional electric field sensor.

Description will now be made in detail as regards embodiments of this invention with reference to the drawing.

Figure 2:
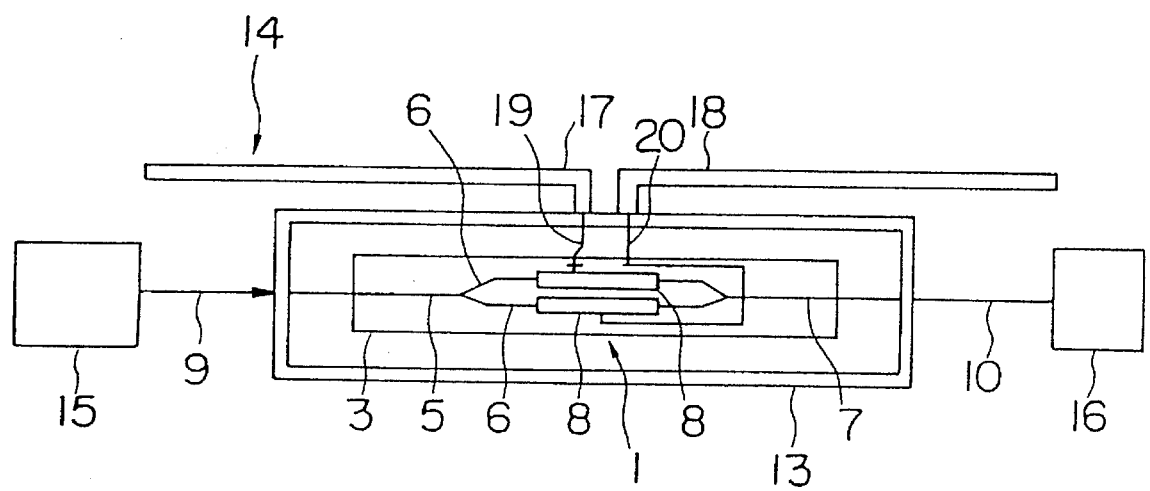
FIG. 2 is a plan view of one embodiment of this invention.

As illustrated in FIG. 2, an electric field sensor according to, this invention comprises a sensor head 1, a package 13 accommodating the sensor head 1, and an antenna 14 attached to the outside of the package 13 and connected to the sensor head 1. The sensor head 1 has a substrate 3 and an optical modulator 4 attached to the substrate 3.

The optical modulator 4 comprises an incident optical waveguide 5 formed on the substrate 3, two phase-shift optical waveguides 6 which are formed on the substrate 3 to be branched from the incident optical waveguide 5 and each of which has a variable refractive index varying in response to an electric field intensity applied thereto, an outgoing optical waveguide 7 formed on the substrate 3 to join the phase-shift optical waveguides 6, and to modulation electrodes 8 formed on or in the vicinity of the phase-shift optical waveguides 6.

The incident optical waveguide 5 is connected to an incident optical fiber 9. The incident optical fiber 9 is connected to a light source 15. For example, the light source 15 comprises a semiconductor laser. The outgoing optical waveguide 7 is connected to an outgoing optical fiber 10. The outgoing optical fiber 10 is connected to an optical detector 16.

The antenna 14 comprises two rod antenna elements 17 and 18. The rod antenna elements 17 and 18 extend in opposite directions with their one ends located at a center portion of the package 13 and are arranged in parallel to the phase-shift optical waveguides 6. The rod antenna elements 17 and 18 are connected through lead wires 19 and 20 to the modulation electrodes 8, respectively.

A light beam from the light source 15 is incident through the incident optical fiber 9 to the incident optical waveguide 5 and branched by the two phase-shift optical waveguides 6 into branched beams which are again combined together in the outgoing optical waveguide 7. The light beam after being combined in the outgoing optical waveguide 7 is emitted through the outgoing optical fiber 10 to the optical detector 16. When the antenna 14 receives a reception signal, the modulation electrodes 8 apply predetermined electric fields to the phase-shift optical waveguides 6. Depending upon the intensities of the electric fields, the refractive indexes of the phase-shift optical waveguides 6 are varied. This results in variation of phases of the light beams transmitted through the phase-shift optical waveguides 6.

A more specific example of the electric field sensor illustrated in FIG. 2 will be described hereinafter. The substrate 3 comprises a LiNbO$_3$ plate. The incident optical waveguide 5, the phase-shift optical waveguides 6, and the outgoing optical waveguide 7 are formed by thermal diffusion of Ti on a Z plane of the substrate 3. The incident optical fiber 9 comprises a constant-polarization optical fiber.

Figure 3:
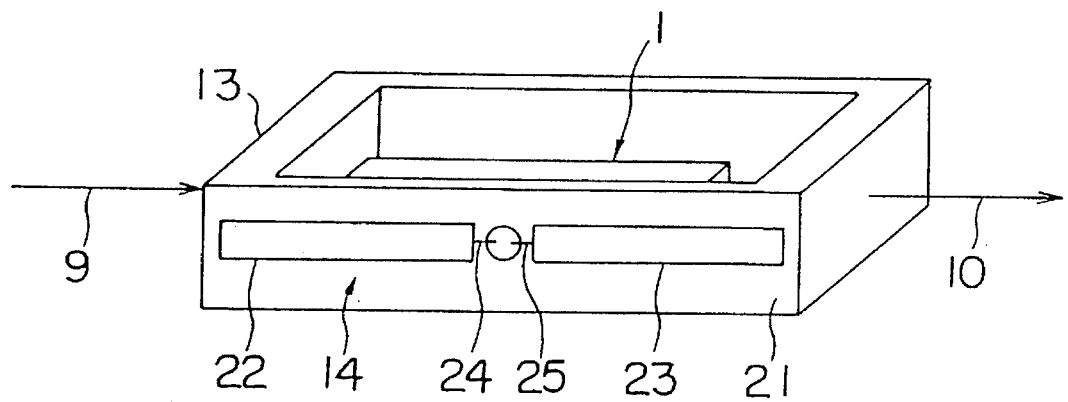
FIG. 3 is a perspective view of another embodiment of this invention.

Another embodiment illustrated in FIG. 3 has similar components depicted by the same reference numerals as those scribed in conjunction with the embodiment of FIG. 2. As illustrated in FIG. 3, the antenna 14 has two film antenna elements 22 and 23 fixedly attached to a side surface 21 of the package 13. The film antenna elements 22 and 23 extend in opposite directions with their one ends located at a center portion of the package 13 and are arranged in parallel to the phase-shift optical waveguides 6. The film antenna elements 22 and 23 are connected through lead wires 24 and 25 to the modulation electrodes 8, respectively.

With the electric field sensors according to the embodiments illustrated in FIGS. 2 and 3, it is possible to prevent a damage of the optical fiber because the draw-out portion of the optical fiber connected to the electric field sensor does not face the direction of measurement.

Figure 4:
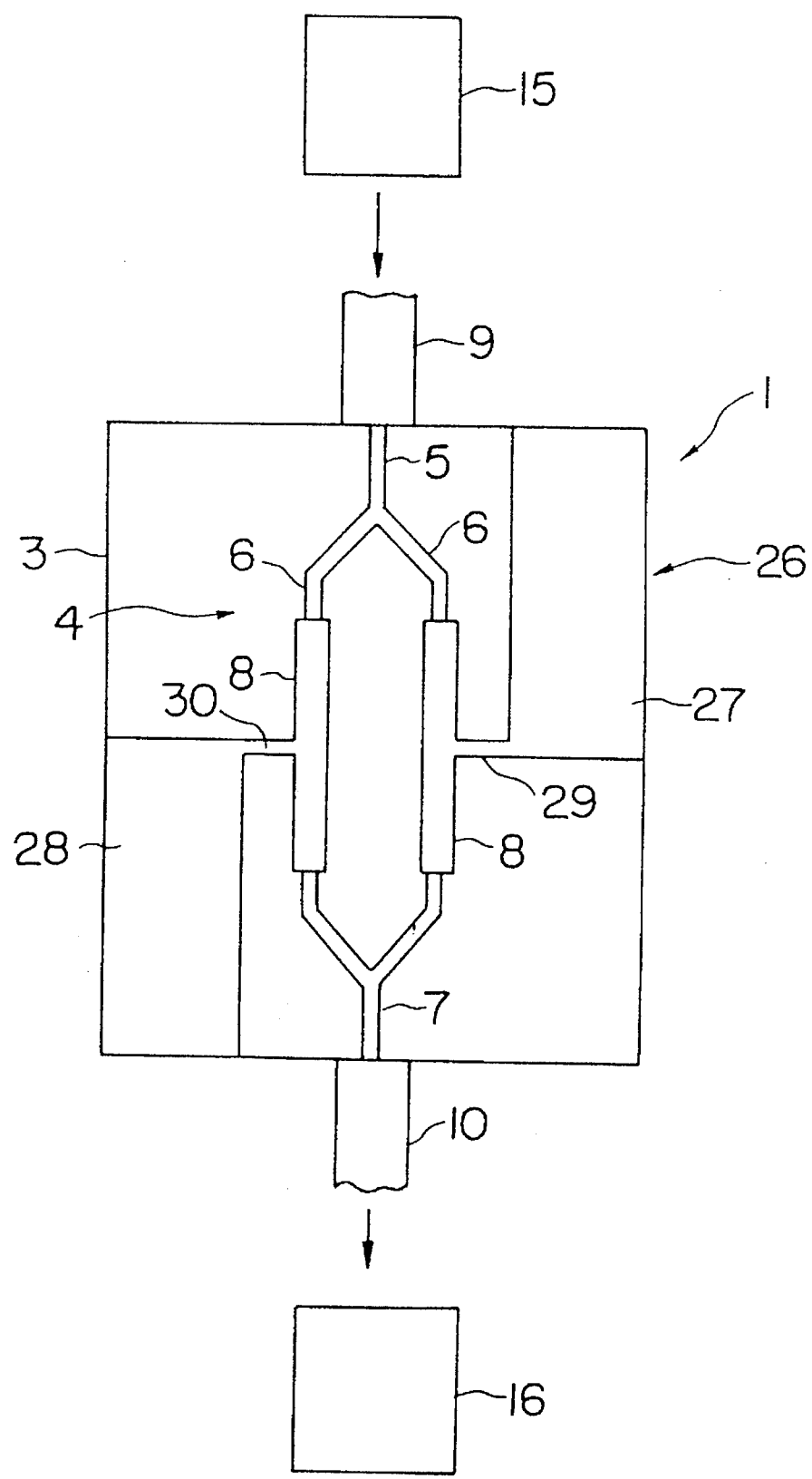
FIG. 4 is a plan view of still another embodiment of this invention.

A still another embodiment illustrated in FIG. 4 has similar components depicted by the same reference numerals as those described in conjunction with the embodiment of FIG. 2. As illustrated in FIG. 4, an antenna 26 has two film antenna elements 27 and 28 formed on the substrate 3 in parallel to the phase-shift optical waveguides 6. The film antenna elements 27 and 28 are arranged on both sides of the phase-shift optical waveguides 6. The film antenna elements 27 and 28 are connected through lead wires 29 and 30 to the modulation electrodes, respectively.

Figure 5:
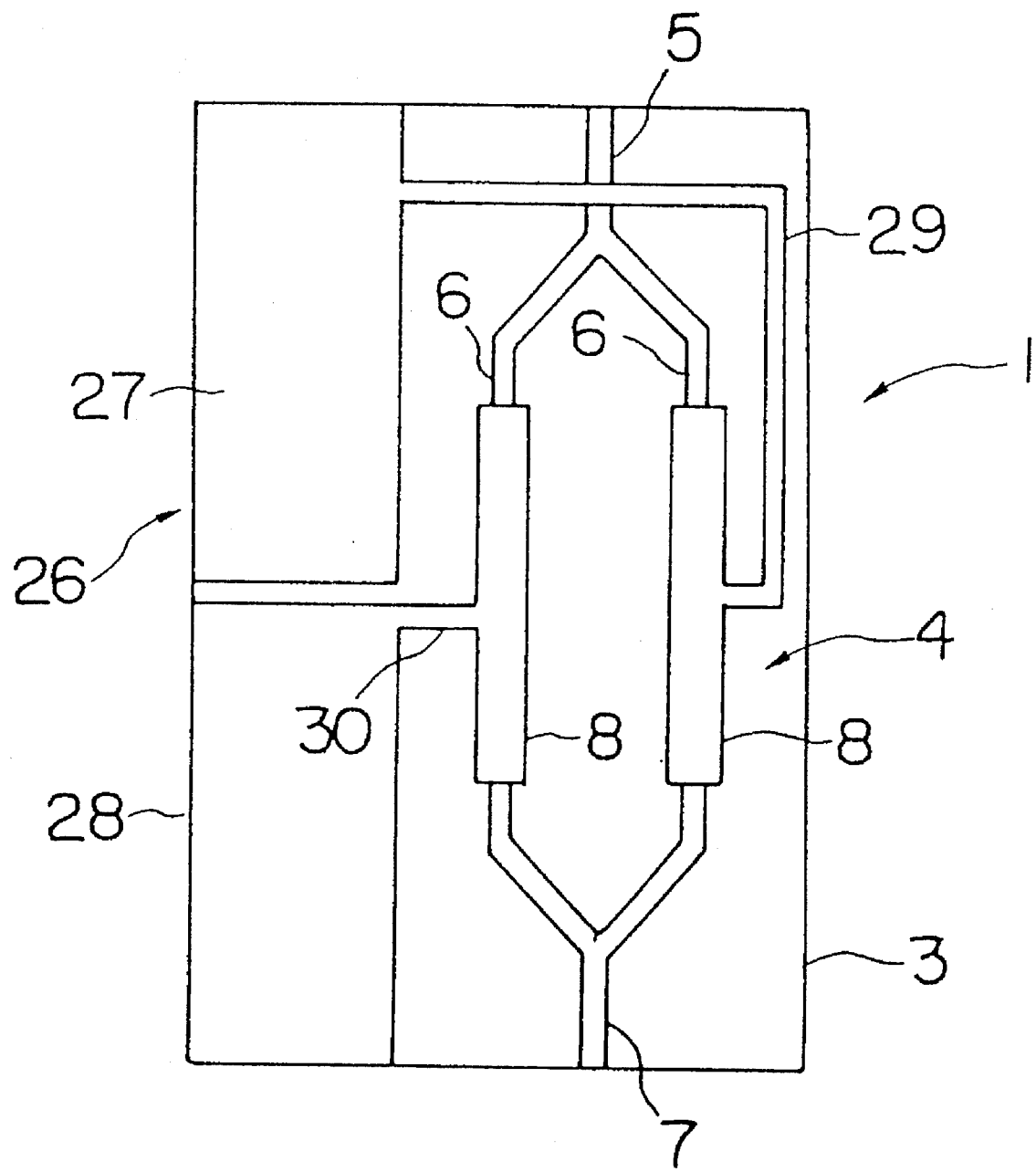
FIG. 5 is a plan view of a further embodiment of this invention.

As illustrated in FIG. 5, the film antenna elements 27 and 28 may be arranged on one side of the phase-shift optical waveguides 6.

Figure 6:
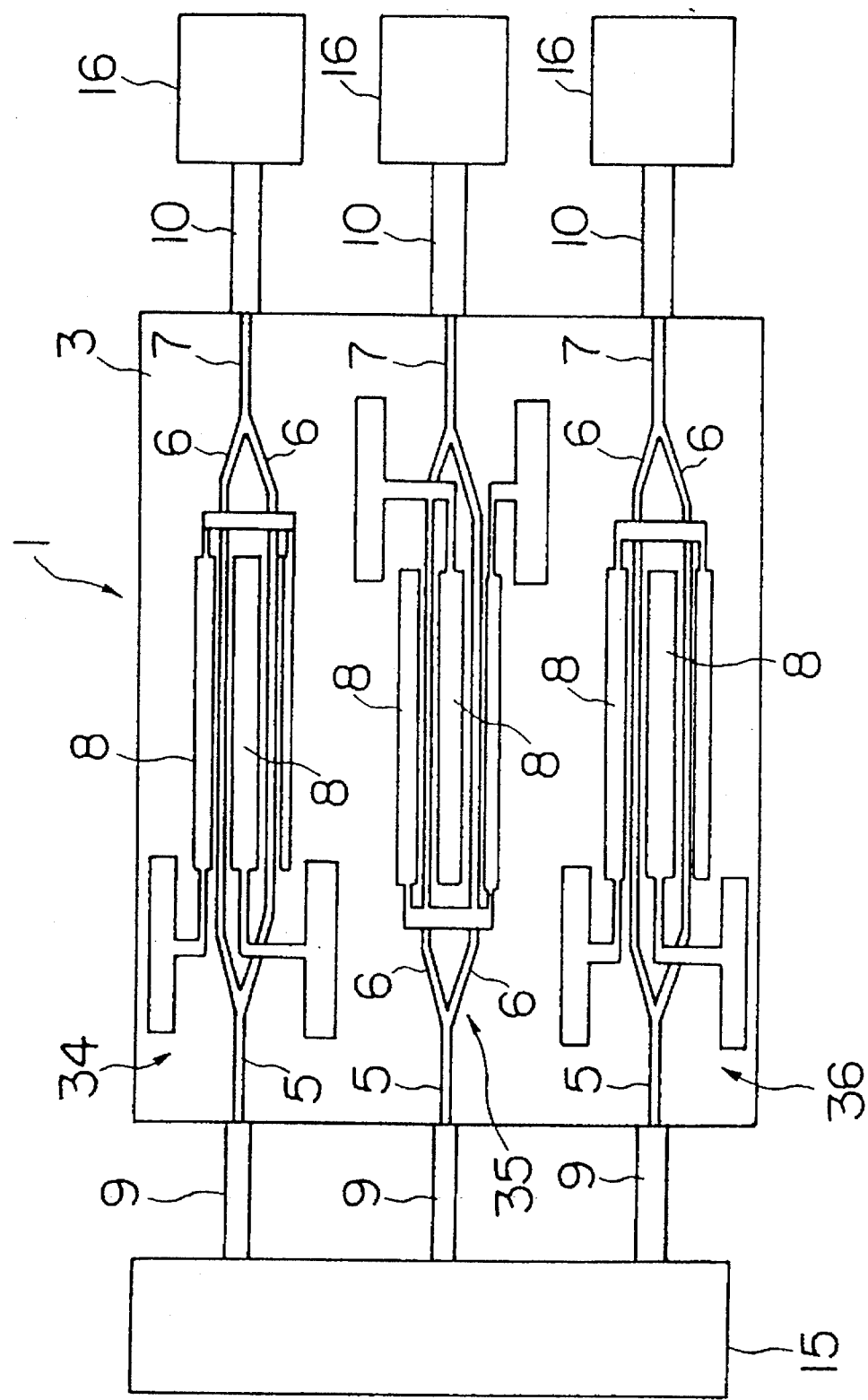
FIG. 6 is a plan view of a still further embodiment of this invention.
Figure 7:
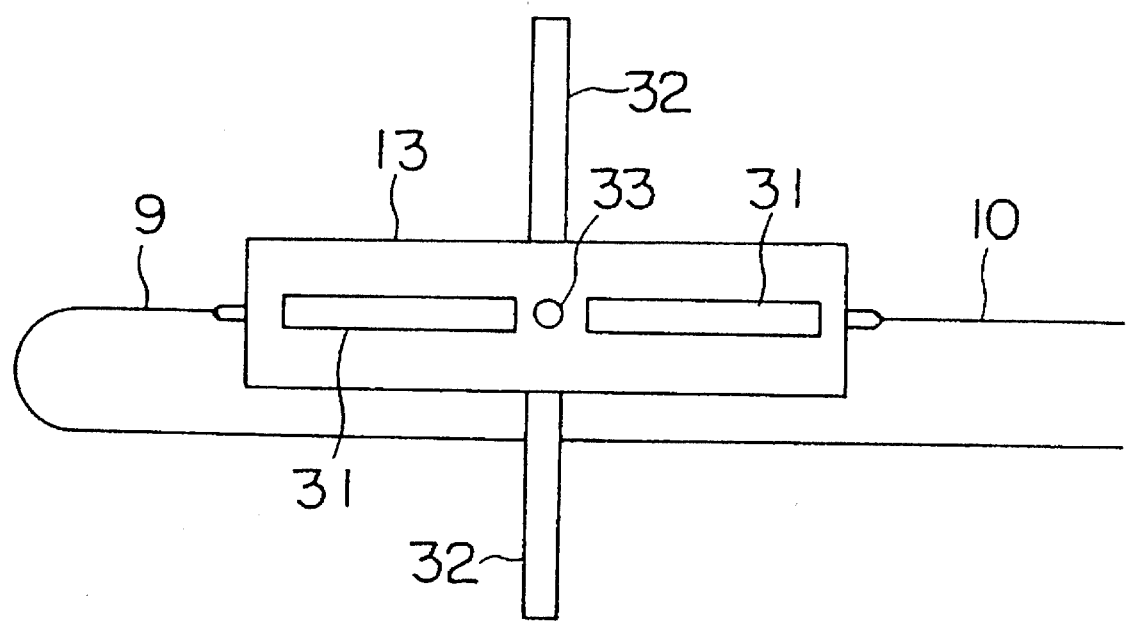
FIG. 7 is a side view of the embodiment in FIG. 6.

With the electric field sensor according to the embodiments illustrated in FIGS. 4 and 5, it is possible to prevent a damage of the optical fiber because the draw-out portion of the optical fiber connected to the electric field senor does not face the direction of measurement. The electric field sensor according to the embodiments in FIGS. 4 and 5 are adapted to achieve reduction of size As illustrated in FIGS. 6 and 7, an electric field sensor according to this invention comprises the sensor head 1, the package 13 accommodating the sensor head 1, and antennas 31, 32, and 33 attached to the outside of the package 13 and connected to the sensor head 1.

The sensor head 1 comprises a substrate 3 and a plurality of optical modulators 34, 35, and 36 attached to the substrate 3.

Each of the optical modulators 34, 35, and 36 has the incident optical waveguide 5 formed on the substrate 3, the two phase-shift optical waveguides 6 which are formed on the substrate 3 to be branched from the incident optical waveguide 5 and each of which has a variable refractive index varying in response to the electric field intensity applied thereto, the outgoing optical waveguide 7 formed on the substrate 3 to join the phase-shift optical waveguides 6, and the two modulation electrodes 8 formed on or in the vicinity of the phase-shift optical waveguides 6.

The incident optical waveguide 5 is connected to the incident optical fiber 9. The incident optical fiber 9 is connected to the light source 15. The outgoing optical waveguide 7 is connected to the outgoing optical fiber 10. The outgoing optical fiber 10 is connected to the optical detector 16.

The antennas 31, 32, and 33 are arranged to be perpendicular to one another. The antennas 31, 32, and 33 are connected through the lead wires to the modulation electrodes 8 of the optical modulators 34, 35, and 36, respectively.

Figure 8:
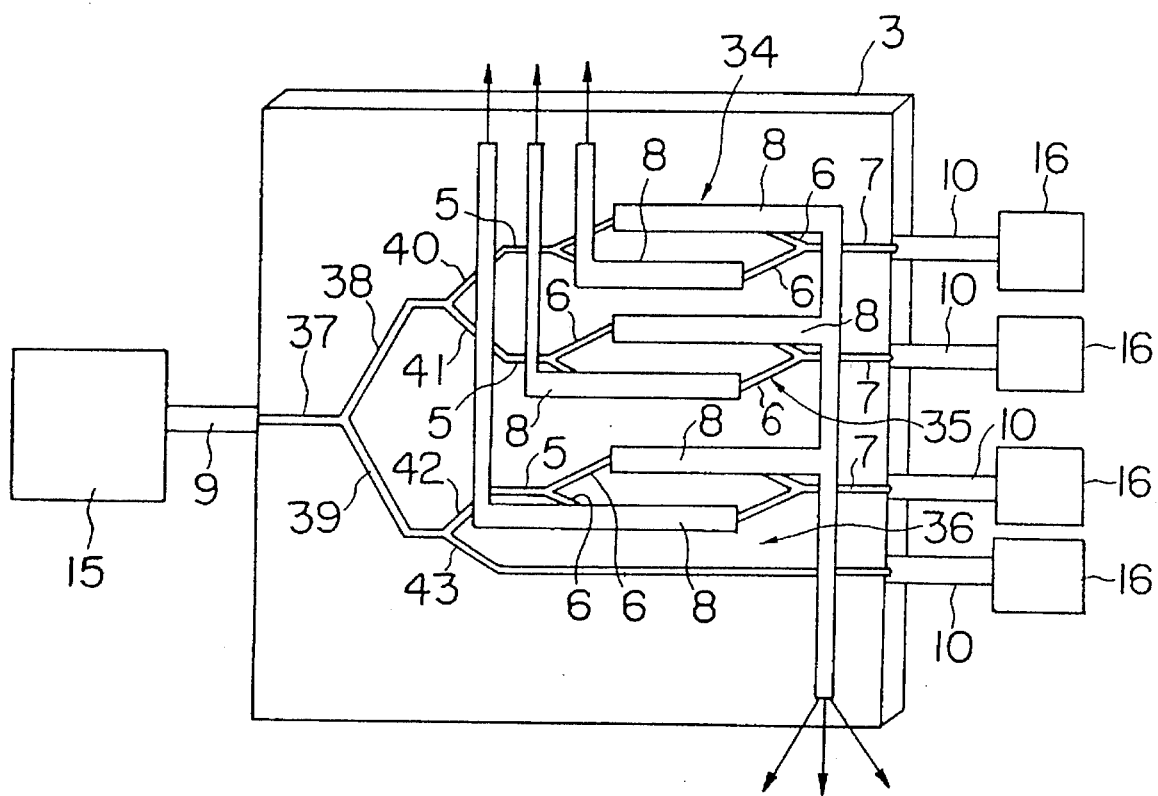
FIG. 8 is a perspective view of a yet further embodiment of this invention.

As illustrated in FIG. 8, each of the optical modulators 34, 35, and 36 has the incident optical waveguide 5 formed on the substrate 3, the two phase-shift optical waveguides 6 which are formed on the substrate 3 to be branched from the incident optical waveguide 5 and each of which has a variable refractive index varying in response to the electric field intensity applied thereto, the outgoing optical waveguide 7 formed on the substrate 3 to join the phase-shift optical waveguides 6, and the two modulation electrodes 8 formed on or in the vicinity of the phase-shift optical waveguides 6.

The sensor head 1 has a common incident optical waveguide 37 connected to the incident optical fiber 9, primary branch optical waveguides 38 and 39 formed on the substrate 3 to be branched from the common incident optical waveguide 37, secondary branch optical waveguides 40 and 41 formed on the substrate 3 to be branched from the primary branch optical waveguide 38, and tertiary branch optical waveguides 42 and 43 formed on the substrate 3 to be ranched from the primary branch optical waveguide 39.

The secondary branch optical waveguide 40 is connected to the incident optical waveguide 5 of the optical modulator 24. The secondary branch optical waveguide 41 is connected to the incident optical waveguide 5 of the optical modulator 35. The tertiary branch optical waveguide 42 is connected to the incident optical waveguide 5 of the optical modulator 36. The tertiary branch optical waveguide 43 is connected through the outgoing optical fiber 10 to the optical detector 16. The light beam transmitted through the tertiary branch optical waveguide 43 is emitted through the outgoing optical fiber 10 to the optical detector 16. The light beam transmitted through the tertiary optical waveguide 43 is used as a reference light beam to monitor the light beam transmitted through the optical modulators 34, 35, and 36.

Each of the embodiments illustrated in FIGS. 6 through 8 has a plurality of antennas. It is therefore unnecessary to change the orientation in various directions during measurement. In addition, it is possible to carry out measurement independent from the incoming direction of the electromagnetic wave to be measured and from the polarization component.

Industrial Applicability

This invention is adapted for use in a device for measuring an intensity of an electric field such as an electromagnetic wave and electromagnetic noise.

We claim:

1. An electric field sensor comprising a sensor head having a substrate and an optical modulator attached to said substrate, a package accommodating said sensor head, and an antenna attached to the outside of said package and connected to said optical modulator, said optical modulator comprising an incident optical waveguide formed on said substrate, two phase-shift optical waveguides which are formed on said substrate to be branched from said incident optical waveguide and each of which has a variable refractive index varying in response to an electric field intensity applied thereto, an outgoing optical waveguide formed on said substrate to join said phase-shift optical waveguides, and two modulation electrodes formed on or in the vicinity of said phase-shift optical waveguides, said antenna having two rod antenna elements respectively connected to said modulation electrodes, said rod antenna elements extending in opposite directions with their one ends located at a center portion of said package and being arranged in parallel to said phase-shift optical waveguides.

2. An electric field sensor comprising a sensor head having a substrate and an optical modulator attached to said substrate, a package accommodating said sensor head, and an antenna attached to the outside of said package and connected to said optical modulator, said optical modulator comprising an incident optical waveguide formed on said substrate, two phase-shift optical waveguides which are formed on said substrate to be branched from said incident optical waveguide and each of which has a variable refractive index varying in response to an electric field intensity applied thereto, an outgoing optical waveguide formed on said substrate to join said phase-shift optical waveguides, and two modulation electrodes formed on or in the vicinity of said phase-shift optical waveguides, said antenna having two film antenna elements respectively connected to said modulation electrodes and fixedly attached to a side surface of said package, said film antenna elements extending in opposite directions with their one ends located at a center portion of said package and being arranged in parallel to said phase-shift optical waveguides.

3. An electric field sensor comprising a sensor head having a substrate and an optical modulator attached to said substrate, and an antenna connected to said optical modulator, said optical modulator comprising an incident optical waveguide formed on said substrate, two phase-shift optical waveguides which are formed on said substrate to be branched from said incident optical waveguide and each of which has a variable refractive index varying in response to an electric field intensity applied thereto, an outgoing optical waveguide formed on said substrate to join said phase-shift optical waveguides, and two modulation electrodes formed on or in the vicinity of said phase-shift optical waveguides, said antenna having two film antenna elements respectively connected to said modulation electrodes and arranged on said substrate in parallel to said phase-shift optical waveguides.

4. An electric field sensor comprising a sensor head having a substrate and a plurality of optical modulators attached to said substrate, and a plurality of antennas respectively connected to said optical modulators, each of said optical modulators comprising an incident optical waveguide formed on said substrate, two phase-shift optical waveguides which are formed on said substrate to be branched from said incident optical waveguide and each of which has a variable refractive index varying in response to an electric field intensity applied thereto, an outgoing optical waveguide formed on said substrate to join said phase-shift optical waveguides, and two modulation electrodes formed on or in the vicinity of sad phase-shift optical waveguides, said antennas being respectively connected to said modulation electrodes of a plurality of said optical modulators.

\* \* \* \* \*